(12) United States Patent
Lin et al.

(10) Patent No.: US 12,368,104 B2
(45) Date of Patent: Jul. 22, 2025

(54) ELECTRONIC PACKAGE

(71) Applicant: Advanced Semiconductor Engineering, Inc., Kaohsiung (TW)

(72) Inventors: Hung-Yi Lin, Kaohsiung (TW); Cheng-Yuan Kung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 567 days.

(21) Appl. No.: 17/715,872

(22) Filed: Apr. 7, 2022

(65) Prior Publication Data
US 2023/0326861 A1    Oct. 12, 2023

(51) Int. Cl.
| | | |
|---|---|---|
| *H01L 23/538* | (2006.01) | |
| *H01L 21/48* | (2006.01) | |
| *H01L 23/00* | (2006.01) | |
| *H01L 23/13* | (2006.01) | |
| *H01L 23/31* | (2006.01) | |
| *H01L 23/48* | (2006.01) | |
| *H01L 23/485* | (2006.01) | |
| *H01L 23/495* | (2006.01) | |
| *H01L 23/498* | (2006.01) | |
| *H01L 25/00* | (2006.01) | |
| *H01L 25/065* | (2023.01) | |
| *H01L 25/18* | (2023.01) | |

(52) U.S. Cl.
CPC ........ *H01L 23/5381* (2013.01); *H01L 23/481* (2013.01); *H01L 23/5385* (2013.01); *H01L 23/5386* (2013.01); *H01L 24/08* (2013.01); *H01L 25/0652* (2013.01); *H01L 2224/08145* (2013.01); *H01L 2224/08265* (2013.01); *H01L 2924/1433* (2013.01); *H01L 2924/1434* (2013.01)

(58) Field of Classification Search
CPC .............. H01L 23/5381; H01L 23/481; H01L 23/5385; H01L 23/5386; H01L 24/08; H01L 25/0652; H01L 2224/08145; H01L 2224/08265; H01L 2924/1433; H01L 2924/1434; H01L 23/13; H01L 23/49816; H01L 23/5384; H01L 25/50; H01L 2225/06541; H01L 2225/06548; H01L 2225/06589; H01L 25/18; H01L 25/16; H01L 21/4825; H01L 23/3128; H01L 23/485; H01L 23/49548; H01L 23/49565
See application file for complete search history.

(56) References Cited

U.S. PATENT DOCUMENTS

| | | | | |
|---|---|---|---|---|
| 2015/0113195 A1* | 4/2015 | Kim | ............... | G06F 13/4027 710/308 |
| 2015/0206867 A1* | 7/2015 | Lim | ............... | G11C 29/025 257/676 |
| 2016/0071818 A1* | 3/2016 | Wang | ............... | H01L 24/49 257/773 |
| 2020/0098725 A1* | 3/2020 | Liff | ............... | H01L 24/16 |
| 2020/0356488 A1* | 11/2020 | Malladi | ............... | G11C 5/025 |

\* cited by examiner

*Primary Examiner* — Herve-Louis Y Assouman
(74) *Attorney, Agent, or Firm* — FOLEY & LARDNER LLP

(57) ABSTRACT

An electronic package is provided. The electronic package includes a first processing component, a second processing component, and a first memory unit. The first memory unit is over the first processing component and the second processing component. The first processing component and the second processing component are configured to access data stored in the first memory unit.

16 Claims, 15 Drawing Sheets

ELECTRONIC PACKAGE

BACKGROUND

1. Technical Field

The present disclosure relates generally to an electronic package.

2. Description of the Related Art

As electronic packages are miniaturized, the number of transistors in a single chip (or processor) increases significantly, and thus the manufacturing yield may decrease due to the increase in difficulties of manufacturing process. In view of the above, a fully-functioned chip (or processor) may be manufactured by breaking down one processor into multiple partitions (or cores) which are manufactured separately followed by integrating and interconnecting those partitions (or cores) together.

SUMMARY

In some embodiments, an electronic package includes a first processing component, a second processing component, and a first memory unit. The first memory unit is over the first processing component and the second processing component. The first processing component and the second processing component are configured to access data stored in the first memory unit.

In some embodiments, an electronic package includes a memory unit, at least two processing units, and a bridging component. The memory unit includes a bottom surface having a first region and a second region distinct from the first region. The at least two processing units are disposed under the first region and the second region, respectively, and electrically connected to the memory unit. The bridging component is disposed over the at least two processing units and configured to transmit a first signal from a first processing unit to a second processing unit of the plurality of processing units.

In some embodiments, an electronic package includes a first processing unit, a second processing unit, and a first memory unit. The first memory unit is stacked on the first processing unit and the second processing unit. The first processing unit, the second processing unit, and the first memory unit have different wafer nodes.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figure 1A:
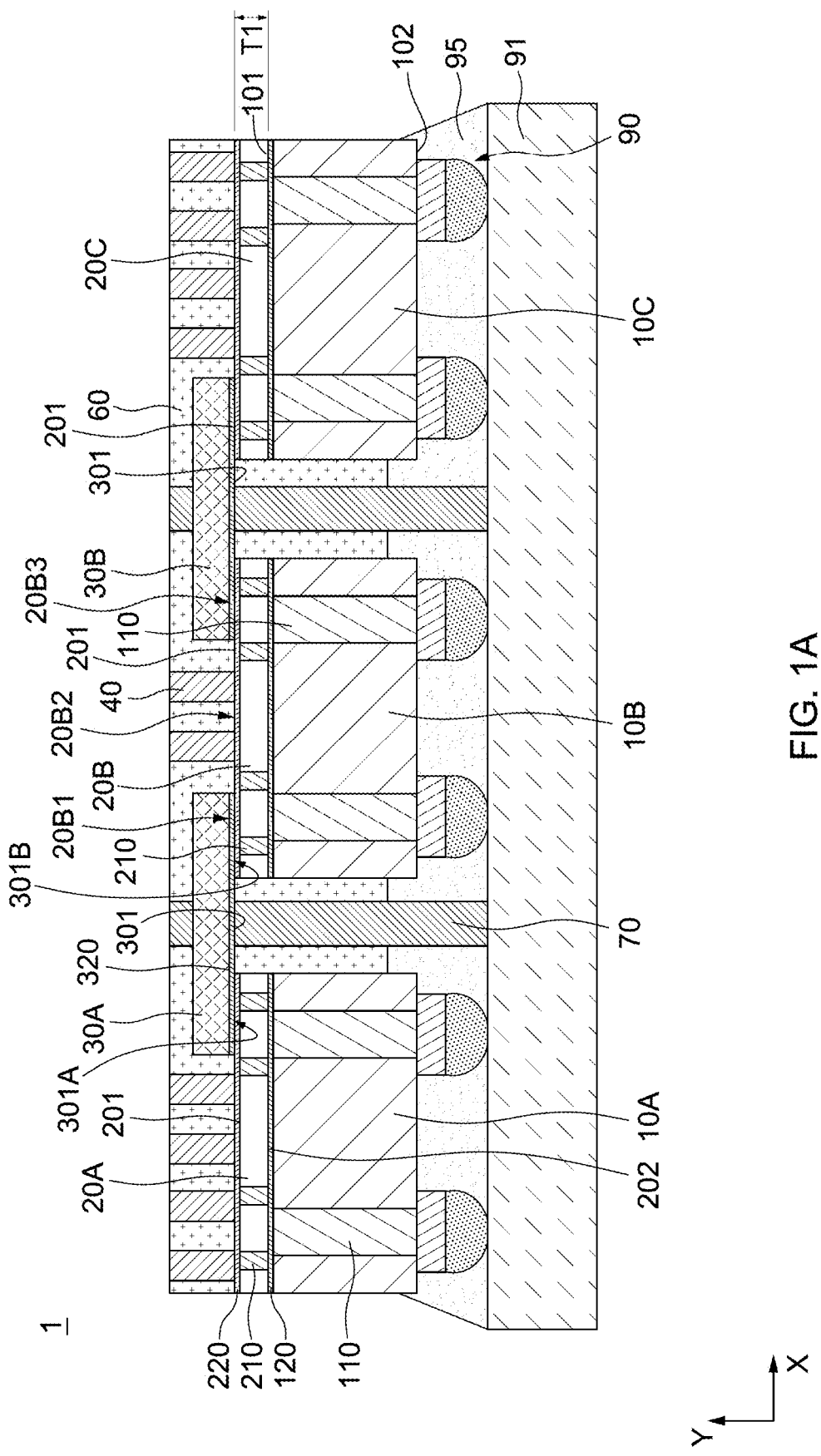
FIG. 1A is a side view of an electronic package in accordance with some embodiments of the present disclosure.

FIG. 1A is a side view of an electronic package 1 in accordance with some embodiments of the present disclosure. The electronic package 1 includes carriers 10A, 10B, and 10C, processing components 20A, 20B, and 20C, memory units 30A and 30B, connection structures 40, 70, 110, and 210, a protective element 60, electrical contacts 90, a substrate 91, and an underfill 95.

Each of the carriers 10A, 10B, and 10C may have a surface 101 and a surface 102 opposite the surface 101. In some embodiments, each of the carriers 10A, 10B, and 10C supports one or more of the processing component 20A, 20B, and 20C. In some embodiments, one or more of the carriers 10A, 10B, and 10C includes a capacitor, a power regulating component, or a combination thereof. In some embodiments, one or more of the carriers 10A, 10B, and 10C is or includes a deep trench capacitor (DTC). In some other embodiments, one or more of the carriers 10A, 10B, and 10C includes an integrated component including a power regulating component and one or more passive components. The power regulating component may include a voltage regulator, such as a linear regulator (configured to maintain a constant output voltage) or a switching regulator (configured to generate an output voltage higher than or lower than the input voltage). The power regulating component may include a step-down (buck) converter, a step-up (boost) converter, an analog-to-digital converter, a digital-to-analog converter, an AC-DC converter, a DC-DC converter, other types of converters, or a combination thereof. The one or more passive components may be or include one or more inductance devices (or inductors) and/or one or more capacitance devices (or capacitors) integrated with the voltage regulator and/or the converter. The one or more passive components may further include one or more passive devices including, for example, resistors, diodes, fuses, antifuses, etc. In some embodiments, each of the carriers 10A, 10B, and 10C includes a conductive layer 120 (e.g., a redistribution layer (RDL) or a circuit region) adjacent to the surface 101. It should be noted that the number of carriers 10A, 10B, and 10C in the present embodiments is only exemplary, and may vary according to actual applications.

The electronic package 1 may include one or more connection structures 110. In some embodiments, the one or more connection structures 110 may be in one or more of the carriers 10A, 10B, and 10C. In some embodiments, the connection structure 110 is configured to carry power. In some embodiments, one or more power paths may pass through one or more connection structures 110. In some embodiments, the connection structure 110 is on the passive surface or backside surface (e.g. surface 202) of one or more of the processing components 20A, 20B, and 20C. In some embodiments, the connection structure 110 is further configured to dissipate heat from one or more of the processing components 20A, 20B, and 20C. In some embodiments, the connection structure 110 includes a conductive via, such as a through silicon via (TSV). According to some embodiments of the present disclosure, the carrier (e.g., the carriers 10A, 10B, and 10C) with the connection structures 110 may be a DTC with TSVs and serve to provide vertical power decoupling function.

Each of the processing components 20A, 20B, and 20C may have a surface 201 (also referred to as "an active surface") and a surface 202 (also referred to as "a passive surface" or "a backside surface") opposite the surface 201. Each of the processing components 20A, 20B, and 20C may be configured to transmit or receive a digital signal through the surface 201 (or the active surface) and transmit power through the surface 202 (or the passive surface). In some embodiments, at least one of the processing components 20A, 20B, and 20C is configured to receive power from the surface 202 (or the passive surface). In some embodiments, each of the processing components 20A, 20B, and 20C includes an active element 220 (e.g., a circuit region) adjacent to the surface 201. The active element 220 may be configured to transmit or receive the digital signal. In some embodiments, each of the processing components 20A, 20B, and 20C has a thickness T1 less than about 20 µm, less than about 15 µm, or less than about 10 µm. The processing component (e.g., the processing components 20A, 20B, and 20C) may be a thinned processing component adhered to a DTC (e.g., the carriers 10A, 10B, and 10C) with TSVs (e.g., the connection structures 110) and transmitting power through the TSVs in the DTC. It should be noted that the number of processing components 20A, 20B, and 20C in the present embodiments is only exemplary, and may vary according to actual applications.

The processing component 20A and the processing component 20B may be configured to access data stored in the memory unit 30A. In some embodiments, the processing component 20A and the processing component 20B are configured to access the memory unit 30A depending on a computing loading of the processing component 20A and the processing component 20B. In some embodiments, the processing component 20A and the processing component 20B are interconnected to each other through the memory unit 30A. In some embodiments, the processing component 20B and the processing component 20C are configured to access data stored in the memory unit 30B. In some embodiments, the processing component 20B and the processing component 20C are configured to access data stored in the memory unit 30B depending on a computing loading of the processing component 20B and the processing component 20C. In some embodiments, the processing component 20B and the processing component 20C are interconnected to each other through the memory unit 30B.

In some embodiments, each of the processing components 20A, 20B, and 20C may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the processing component (e.g., the processing component 20A, 20B, and/or 20C) may include one or more processing elements and one or more memory elements electrically connected to the processing elements. The processing element(s) and the memory element(s) may be divided from or originate in a monolithic processing unit (e.g., a CPU, a MPU, a GPU, a MCU, an ASIC, or the like). In some embodiments, the processing element may be a CPU chiplet, a MCU chiplet, a GPU chiplet, an ASIC chiplet, or the like. In some embodiments, the memory element may be or include a cache memory. In some embodiments, each of the processing components 20A, 20B, and 20C may be or include a processing core.

The electronic package 1 may include one or more connection structures 210. In some embodiments, the connection structure 210 passes through or penetrates at least a portion of the processing component (e.g., the processing components 20A, 20B, and 20C) and is configured to provide a power path. In some embodiments, the connection structure 210 is connected to the surface 202 (or the passive surface) of the processing component (e.g., the processing components 20A, 20B, and 20C). The power path may pass through the connection structure 110 and the connection structure 210. In some embodiments, the connection structure 110 is configured to transmit a power to the connection structure 210. In some embodiments, the connection structure 210 is extending from the surface 202 (or the passive surface) of the processing component (e.g., the processing components 20A, 20B, and 20C).

The memory unit 30A may be disposed over or stacked on the processing component 20A and the processing component 20B. In some embodiments, the memory unit 30A includes an active surface 301 (also referred to as "a bottom surface") hybrid-bonded to the surface 201 (or the active surface) of the processing component 20A and the surface 201 (or the active surface) of the processing component 20B. In some embodiments, the active surface 301 of the memory unit 30A is bonded to the surface 201 of the processing component 20A and the surface 201 of the processing component 20B through a solder-free joint or a non-solder joint. In some embodiments, the active surface 301 of the memory unit 30A is in direct contact with the surface 201 of the processing component 20A and/or the surface 201 of the processing component 20B. In some embodiments, the active surface 301 of the memory unit 30A is closer to the surface 201 (or the active surface) than the surface 202 (or the passive surface) of the processing component 20B. In some embodiments, the active surface 301 (or the bottom surface) of the memory unit 30A has a region 301A (also referred to as "an access region") and a region 301B (also referred to as "an access region") distinct from the region 301A. In some embodiments, the processing components 20A and 20B (or the processing units) are disposed under the regions 301A and 301B, respectively, and electrically connected to the memory unit 30A. In some embodiments, the region 301A (or the access region) is accessed by the processing component 20A, and the region 301B (or the access region) is access by the processing component 20B. In some embodiments, a ratio of a occupied capacity of the region 301A (or the access region) and a occupied capacity of the region 301B (or the access region) depends on a computing loading of the processing component 20A and the processing component 20B. In some embodiments, the memory unit 30A includes an active element 320 (e.g., a circuit region) adjacent to the active surface 301 of the memory unit 30A. In some embodiments, the active element 320 of the memory unit 30A is bonded to the surface 201 (or the active surface) of the processing component 20A and the surface 201 (or the active surface) of the processing component 20B through a solder-free joint or a non-solder joint.

The memory unit 30B may be over the processing component 20B and the processing component 20C. In some embodiments, the memory unit 30B includes an active surface 301 hybrid-bonded to the surface 201 (or the active surface) of the processing component 20B and the surface 201 (or the active surface) of the processing component 20C. In some embodiments, the active surface 301 of the memory unit 30B is bonded to the surface 201 of the processing component 20B and the surface 201 of the processing component 20C through a solder-free joint or a non-solder joint. In some embodiments, the active surface 301 of the memory unit 30A is in direct contact with the surface 201 of the processing component 20B and/or the surface 201 of the processing component 20C. In some embodiments, the memory unit 30B includes an active element 320 (e.g., a circuit region) adjacent to the active surface 301 of the memory unit 30B. In some embodiments, the active element 320 of the memory unit 30B is bonded to the surface 201 (or the active surface) of the processing component 20B and the surface 201 (or the active surface) of the processing component 20C through a solder-free joint or a non-solder joint.

In some embodiments, the memory unit 30A and the memory unit 30B are interconnected to each other through the processing component 20B. In some embodiments, the processing component 20B has a portion 20B1 covered by the memory unit 30A and a portion 20B2 exposed from the memory unit 30A. In some embodiments, the processing component 20B further has a portion 20B3 covered by the memory unit 30B. It should be noted that the number of memory units 30A, 30B, and 30C in the present embodiments is only exemplary, and may vary according to actual applications.

The memory unit (e.g., the memory units 30A and 30B) may be a cache memory. In some embodiments, the processing component 20A, the processing component 20B, and the memory unit 30A have different wafer nodes. In some embodiments, a wafer node of the processing element of the processing component (e.g., the processing components 20A, 20B, and 20C) is less or smaller than a wafer node of the memory unit. In some embodiments, a wafer node of the processing component (or the processing core) is less or smaller than a wafer node of the memory unit. A wafer node of the processing component (or the processing core) may lead a wafer node of the memory unit by one or more generations. For example, the processing component (or the processing core) may be a 5 nm or less node wafer, such as a 3 nm or less node wafer, a 2 nm or less node wafer, or less, and the memory unit may be a 20 nm or more node wafer, such as a 28 nm or more node wafer, a 32 nm or more node wafer, or greater. The memory unit may be configured to provide additional memory capacity for the processing component (or the processing core) in addition to the built-in memory of the processing component.

The electronic package 1 may include one or more connection structures 40. In some embodiments, the connection structure 40 is on the portion 20B2 of the processing component 20B exposed from the memory units 30A and 30B. In some embodiments, the connection structure 40 on the portion 20B2 of the processing component 20B is configured to provide an electrical path for external connection. In some embodiments, the connection structure 40 is configured to receive a signal from the processing component 20B passing through the surface 201 (or the active surface) of the processing component 20B. In some embodiments, the connection structure 40 is electrically connected to the surface 201 (or the active surface) of the processing component 20B. In some embodiments, the connection structures 40 may be further on the processing component 20A and configured to provide an electrical path for external connection. In some embodiments, the connection structures 40 may be further on the processing component 20C and configured to provide an electrical path for external connection. In some embodiments, the connection structures 40 may be electrically connected to the active surface of the processing component 20A. In some embodiments, the connection structures 40 may be electrically connected to the active surface of the processing component 20C. In some embodiments, the connection structures 40 include a plurality of conductive pillars. The conductive pillars may be formed of or include copper (Cu). In some embodiments, a pitch of the connection structures 40 is less than about 30 µm, less than about 25 µm, or less than about 20 µm.

The protective element 60 may be disposed on the processing components 20A, 20B, and 20C. In some embodiments, the protective element 60 covers or encapsulates the carriers 10A, 10B, and 10C. In some embodiments, the protective element 60 covers or encapsulates the processing components 20A, 20B, and 20C. In some embodiments, the protective element 60 covers or encapsulates the memory units 30A and 30B. In some embodiments, the protective element 60 covers or encapsulates the connection structures 40. In some embodiments, the protective element 60 includes an encapsulant or a dielectric structure. The protective element 60 may include an epoxy resin including fillers, a molding compound (e.g., an epoxy molding compound or other molding compound), polyimide, a phenolic compound or material, a material including silicone dispersed therein, or a combination thereof.

The electronic package 1 may include one or more connection structures 70. In some embodiments, the connection structure 70 may pass through or penetrate the protective element 60. In some embodiments, a height of the connection structure 70 is greater than or exceeds a height of the connection structure 40. In some embodiments, the connection structure 70 is configured to carry power or conduct power. In some embodiments, the connection structure 70 is configured to connect to ground. In some embodiments, the connection structure 70 is configured to dissipate heat from inside the electronic package 1 toward a heat dissipation structure (e.g., a heat dissipation structure 96 which will be discussed hereinafter). In some embodiments, the connection structure 70 is configured to dissipate heat from the carriers 10A and 10B and the memory unit 30A toward a heat dissipation structure (e.g., the heat dissipation structure 96 which will be discussed hereinafter). In some embodiments, the connection structure 70 is disposed between the adjacent carriers 10A and 10B. In some embodiments, the connection structure 70 is further disposed between the adjacent carriers 10B and 10C. In some embodiments, the connection structure 70 extends along a lateral surface of one or more of the carriers 10A, 10B, and 10C. In some embodiments, the connection structure 70 is disposed between the adjacent processing components 20A and 20B. In some embodiments, a portion of the connection structure 70 extends along a lateral side of the memory unit 30A. In some embodiments, the connection structure 70 is or includes a conductive pillar.

The electrical contacts 90 may be disposed on the surfaces 102 of the carriers 10A, 10B, and 10C. In some embodiments, the electrical contacts 90 electrically connect the connection structures 110 and the substrate 91. In some embodiments, the electrical contacts 90 include controlled collapse chip connection (C4) bumps, a ball grid array (BGA), or a land grid array (LGA).

The substrate 91 may include, for example, a printed circuit board, such as a paper-based copper foil laminate, a composite copper foil laminate, or a polymer-impregnated glass-fiber-based copper foil laminate. The substrate 91 may include an interconnection structure, such as a plurality of conductive traces or a through via. In some embodiments, the substrate 91 includes a ceramic material or a metal plate. In some embodiments, the substrate 91 may include an organic substrate or a leadframe. In some embodiments, the substrate 91 may include a two-layer substrate which includes a core layer and a conductive material and/or structure disposed on an upper surface and a bottom surface of the substrate 91. The conductive material and/or structure may include a plurality of traces. In some embodiments, the substrate 91 includes circuits, and the electrical contact 90 (e.g. a solder ball) can electrically connect the carriers 10A, 10B, and 10C to the circuits of the substrate 91.

In some embodiments, the underfill 95 covers the electrical contacts 90. In some embodiments, the underfill 95 further covers a portion of the carriers 10A, 10B, and 10C and a portion of the connection structures 70. In some embodiments, the protective element 60 contacts the underfill 95.

In some other embodiments, the electronic package 1 may be free of the underfill 95 (not shown in drawings), and the protective element 60 may further cover or encapsulate the electrical contacts 90.

Figure 1B:
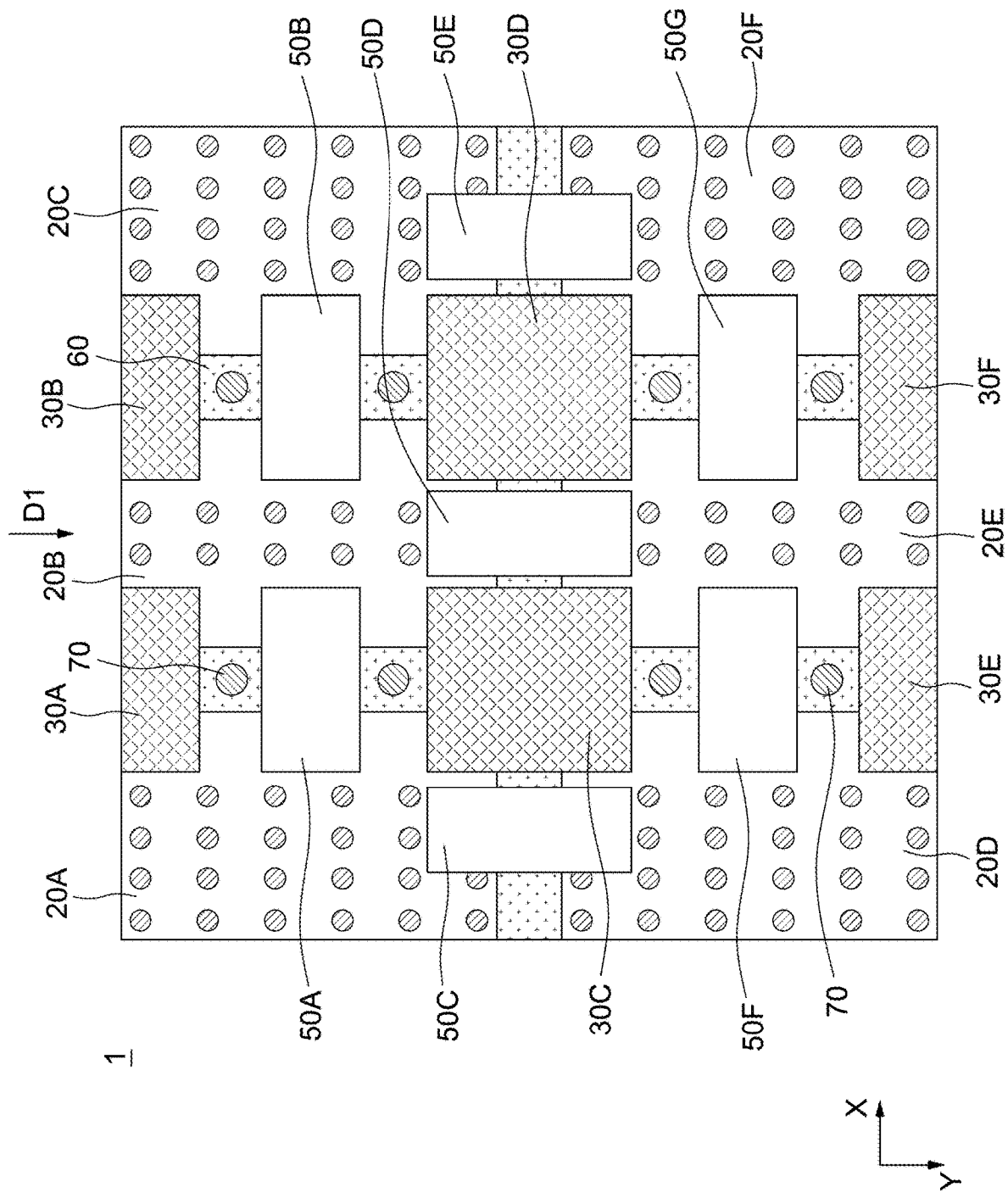
FIG. 1B is a top view of an electronic package in accordance with some embodiments of the present disclosure.

FIG. 1B is a top view of an electronic package 1 in accordance with some embodiments of the present disclosure. In some embodiments, FIG. 1A is a side view of the structure shown in FIG. 1B as viewed from a perspective D1. It should be noted that some components or structures are omitted for clarity.

In some embodiments, the electronic package 1 further includes one or more bridging components (e.g., bridging components 50A, 50B, 50C, 50D, and 50E), processing components 20D, 20E, and 20F, and memory units 30C, 30D, 30E, and 30F.

In some embodiments, the processing components 20A, 20B, 20C, 20D, 20E, and 20F are spaced apart from each other. In some embodiments, the bridging components are configured to transmit signals between the processing components. In some embodiments, the bridging component 50A is stacked on the processing component 20A and the processing component 20B. In some embodiments, the bridging component 50A is over and electrically connecting the processing component 20A and the processing component 20B. In some embodiments, the bridging component 50B is stacked on the processing component 20B and the processing component 20C. In some embodiments, the bridging component 50B is over and electrically connecting the processing component 20B and the processing component 20C. In some embodiments, the bridging component 50C is stacked on the processing component 20A and the processing component 20D. In some embodiments, the bridging component 50C is over and electrically connecting the processing component 20A and the processing component 20D. In some embodiments, the bridging component 50D is stacked on the processing component 20B and the processing component 20E. In some embodiments, the bridging component 50D is over and electrically connecting the processing component 20B and the processing component 20E. In some embodiments, the bridging component 50E is stacked on the processing component 20C and the processing component 20F. In some embodiments, the bridging component 50E is over and electrically connecting the processing component 20C and the processing component 20F. In some embodiments, the bridging component 50F is stacked on the processing component 20D and the processing component 20E. In some embodiments, the bridging component 50F is over and electrically connecting the processing component 20D and the processing component 20E. In some embodiments, the bridging component 50G is stacked on the processing component 20E and the processing component 20F. In some embodiments, the bridging component 50G is over and electrically connecting the processing component 20E and the processing component 20F.

In some embodiments, the bridging component (e.g., the bridging component 50A, 50B, 50C, 50D, and/or 50E) is disposed over at least two processing components (or processing units) and configured to transmit a signal from one processing component to another processing component of the at least two processing components. In some embodiments, the bridging component 50A is stacked on or disposed over the processing component 20A and the processing component 20B and configured to transmit a signal from the processing component 20A to the processing component 20B and/or from the processing component 20B to the processing component 20A. Likewise, each of the bridging components 50B, 50C, 50D, and 50E may be configured to transmit a signal from one processing component to another processing component which are disposed thereunder.

In some embodiments, the processing component 20B and the processing component 20E are configured to access data stored in the memory unit 30C. In some embodiments, the processing component 20B and the processing component 20E are configured to access the memory unit 30C depending on a computing loading of the processing component 20B and the processing component 20E. In some embodiments, the memory unit 30A and the memory unit 30C are interconnected to each other through the processing component 20B. In some embodiments, the processing component 20A and the processing component 20B are configured to access data stored in the memory unit 30C. In some embodiments, the processing component 20A and the processing component 20B are configured to access the memory unit 30C depending on a computing loading of the processing component 20A and the processing component 20B. In some embodiments, the processing components 20A, 20B, and 20E are configured to access data stored in the memory unit 30C. In some embodiments, the processing components 20A, 20B, and 20E are configured to access the memory unit 30C depending on a computing loading of the processing components 20A, 20B, and 20E.

In some embodiments, the processing component 20A and the processing component 20D are configured to access data stored in the memory unit 30C. In some embodiments, the processing component 20A and the processing component 20D are configured to access the memory unit 30C depending on a computing loading of the processing component 20A and the processing component 20D. In some embodiments, the memory unit 30A and the memory unit 30C are interconnected to each other through the processing component 20A. In some embodiments, the processing component 20D and the processing component 20E are configured to access data stored in the memory unit 30C. In some embodiments, the processing component 20D and the processing component 20E are configured to access the memory unit 30C depending on a computing loading of the processing component 20D and the processing component 20E. In some embodiments, the processing components 20A, 20D, and 20E are configured to access data stored in the memory unit 30C. In some embodiments, the processing components 20A, 20D, and 20E are configured to access the memory unit 30C depending on a computing loading of the processing components 20A, 20D, and 20E.

In some embodiments, the processing components 20A, 20B, and 20D are configured to access data stored in the memory unit 30C. In some embodiments, the processing components 20A, 20B, and 20D are configured to access the memory unit 30C depending on a computing loading of the processing components 20A, 20B, and 20D. In some embodiments, the processing components 20B, 20D, and 20E are configured to access data stored in the memory unit 30C. In some embodiments, the processing components 20B, 20D, and 20E are configured to access the memory unit 30C depending on a computing loading of the processing components 20B, 20D, and 20E. In some embodiments, the processing components 20A, 20B, 20D, and 20E are configured to access data stored in the memory unit 30C. In some embodiments, the processing components 20A, 20B, 20D, and 20E are configured to access the memory unit 30C depending on a computing loading of the processing components 20A, 20B, 20D, and 20E.

In some embodiments, the processing component 20D and the processing component 20E are configured to access data stored in the memory unit 30E. In some embodiments, the processing component 20D and the processing component 20E are configured to access the memory unit 30E depending on a computing loading of the processing component 20D and the processing component 20E. In some embodiments, the memory unit 30C and the memory unit 30E are interconnected to each other through the processing component 20D and/or the processing component 20E.

In some embodiments, the processing component 20B and the processing component 20E are configured to access data stored in the memory unit 30D. In some embodiments, the processing component 20B and the processing component 20E are configured to access the memory unit 30D depending on a computing loading of the processing component 20B and the processing component 20E. In some embodiments, the memory unit 30B and the memory unit 30D are interconnected to each other through the processing component 20B. In some embodiments, the processing component 20B and the processing component 20C are configured to access data stored in the memory unit 30D. In some embodiments, the processing component 20B and the processing component 20C are configured to access the memory unit 30D depending on a computing loading of the processing component 20B and the processing component 20C. In some embodiments, the processing components 20B, 20C, and 20E are configured to access data stored in the memory unit 30D. In some embodiments, the processing components 20B, 20C, and 20E are configured to access the memory unit 30D depending on a computing loading of the processing components 20B, 20C, and 20E.

In some embodiments, the processing component 20C and the processing component 20F are configured to access data stored in the memory unit 30D. In some embodiments, the processing component 20C and the processing component 20F are configured to access the memory unit 30D depending on a computing loading of the processing component 20C and the processing component 20F. In some embodiments, the memory unit 30B and the memory unit 30D are interconnected to each other through the processing component 20C. In some embodiments, the processing component 20E and the processing component 20F are configured to access data stored in the memory unit 30D. In some embodiments, the processing component 20E and the processing component 20F are configured to access the memory unit 30D depending on a computing loading of the processing component 20E and the processing component 20F. In some embodiments, the processing components 20C, 20E, and 20F are configured to access data stored in the memory unit 30D. In some embodiments, the processing components 20C, 20E, and 20F are configured to access the memory unit 30D depending on a computing loading of the processing components 20C, 20E, and 20F.

In some embodiments, the processing components 20B, 20C, and 20F are configured to access data stored in the memory unit 30D. In some embodiments, the processing components 20B, 20C, and 20F are configured to access the memory unit 30D depending on a computing loading of the processing components 20B, 20C, and 20F. In some embodiments, the processing components 20B, 20E, and 20F are configured to access data stored in the memory unit 30D. In some embodiments, the processing components 20B, 20E, and 20F are configured to access the memory unit 30D depending on a computing loading of the processing components 20B, 20E, and 20F. In some embodiments, the processing components 20B, 20C, 20E, and 20F are configured to access data stored in the memory unit 30D. In some embodiments, the processing components 20B, 20C, 20E, and 20F are configured to access the memory unit 30D depending on a computing loading of the processing components 20B, 20C, 20E, and 20F.

In some embodiments, the processing component 20E and the processing component 20F are configured to access data stored in the memory unit 30F. In some embodiments, the processing component 20E and the processing component 20F are configured to access the memory unit 30F depending on a computing loading of the processing component 20E and the processing component 20F. In some embodiments, the memory unit 30D and the memory unit 30F are interconnected to each other through the processing component 20E and/or the processing component 20F.

In some embodiments, an active surface of the memory unit 30C is hybrid-bonded to the active surface of the processing component 20A and the active surface of the processing component 20B. In some embodiments, the active surface of the memory unit 30C is hybrid-bonded to an active surface of the processing component 20D and an active surface of the processing component 20E. In some embodiments, the active surface of the memory unit 30E is hybrid-bonded to the active surface of the processing component 20D and the active surface of the processing component 20E. In some embodiments, an active surface of the memory unit 30D is hybrid-bonded to the active surface of the processing component 20B and the active surface of the processing component 20C. In some embodiments, the active surface of the memory unit 30D is hybrid-bonded to the active surface of the processing component 20E and an active surface of the processing component 20F. In some embodiments, an active surface of the memory unit 30F is hybrid-bonded to the active surface of the processing component 20E and an active surface of the processing component 20F.

In some embodiments, the memory unit 30C is stacked on the processing components 20A, 20B, 20D, and 20E. In some embodiments, the memory unit 30D is stacked on the processing components 20B, 20C, 20E, and 20F. In some embodiments, the memory unit 30E is stacked on the processing components 20D and 20E. In some embodiments, the memory unit 30F is stacked on the processing components 20E and 20F.

In some embodiments, one or more of the connection structures 70 may be disposed between the adjacent processing components 20A and 20B. In some embodiments, a portion of the connection structure 70 extends along a lateral side of the memory unit 30A. In some embodiments, one or more of the connection structures 70 may be between the memory unit 30A and the bridging component 50A. In some embodiments, one or more of the connection structures 70 may be between the memory unit 30A, the bridging component 50A, and two adjacent processing components. In some embodiments, one or more of the connection structures 70 may be spaced apart from the memory unit 30A by the protective element 60. In some embodiments, one or more of the connection structures 70 may be spaced apart from the bridging component 50A by the protective element 60.

According to some embodiments of the present disclosure, two or more processing components (or processing cores) are configured to access data stored in one memory unit (or cache memory), and thus the memory capacity of the memory unit can be distributed according to the computing loading of the two or more components (or processing cores). Therefore, the memory capacity efficiency can be significantly increased.

In addition, according to some embodiments of the present disclosure, the memory unit bonded to two or more processing components (or processing cores) can provide additional memory capacity for the processing component (or the processing core) in addition to the built-in memory of the processing component. Therefore, the memory unit shared by two or more processing components (or processing cores) can not only provide additional memory capacity but also increase memory capacity efficiency.

Moreover, according to some embodiments of the present disclosure, the memory unit is hybrid-bonded to the active surface of the processing component, and/or the memory unit is bonded to the active surface of the processing component through a solder-free joint or a non-solder joint. Therefore, the resistance of the transmission path between the memory unit and the processing component is relatively low, which is advantageous to improving the access rate for the processing component.

In cases where a memory unit is integrated into a processing component during manufacture, the process for forming processing elements of the processing component demands increased precision (e.g., a relatively high processing precision), and thus the memory unit formed together with the processing elements also demands increased precision (e.g., a relatively high processing precision), which can increase process complexity as well as costs In contrast, according to some embodiments of the present disclosure, a wafer node of the processing component (or the processing core) is less than or smaller than a wafer node of the memory unit, and the memory unit is manufactured separately from the processing component and then bonded to the active surface of the processing component. Therefore, the precision required for manufacturing the memory unit is less than that for manufacturing the processing component (or the processing core), and processes requiring different levels of processing precision are performed separately, simplifying overall process and reducing costs.

Figure 1C:
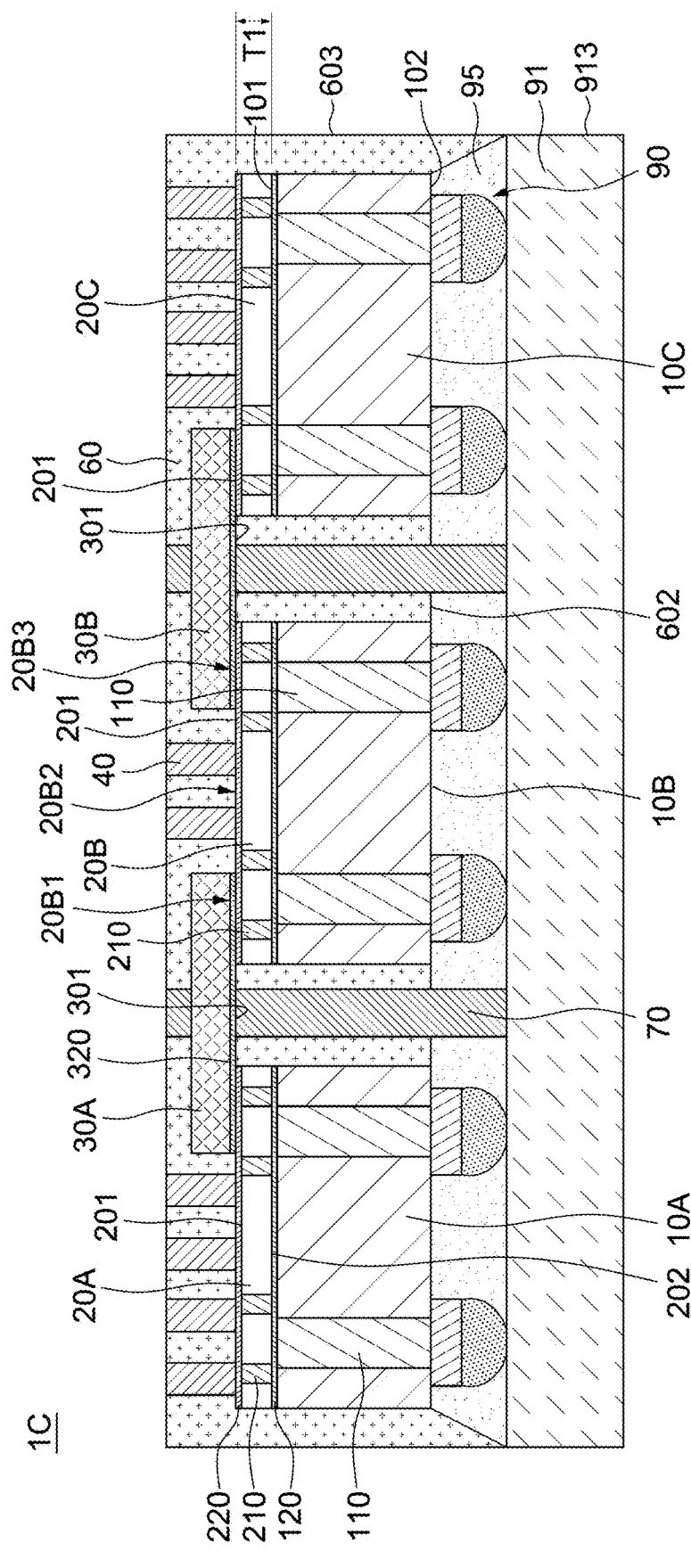
FIG. 1C is a side view of an electronic package in accordance with some embodiments of the present disclosure.

FIG. 1C is a side view of an electronic package 1C in accordance with some embodiments of the present disclosure. The electronic package 1C is similar to the electronic package 1 shown in FIG. 1A, with differences therebetween as follows. Descriptions of similar components are omitted.

In some embodiments, a surface 602 (also referred to as "a bottom surface") of the protective element 60 is substantially aligned with the surfaces 102 (or the bottom surfaces) of the carriers 10A, 10B, and 10C. In some embodiments, at least one lateral surface 603 (also referred to as "lateral side") of the protective element 60 is substantially aligned with at least one lateral surface 913 (also referred to as "lateral side") of the substrate 91.

Figure 2A:
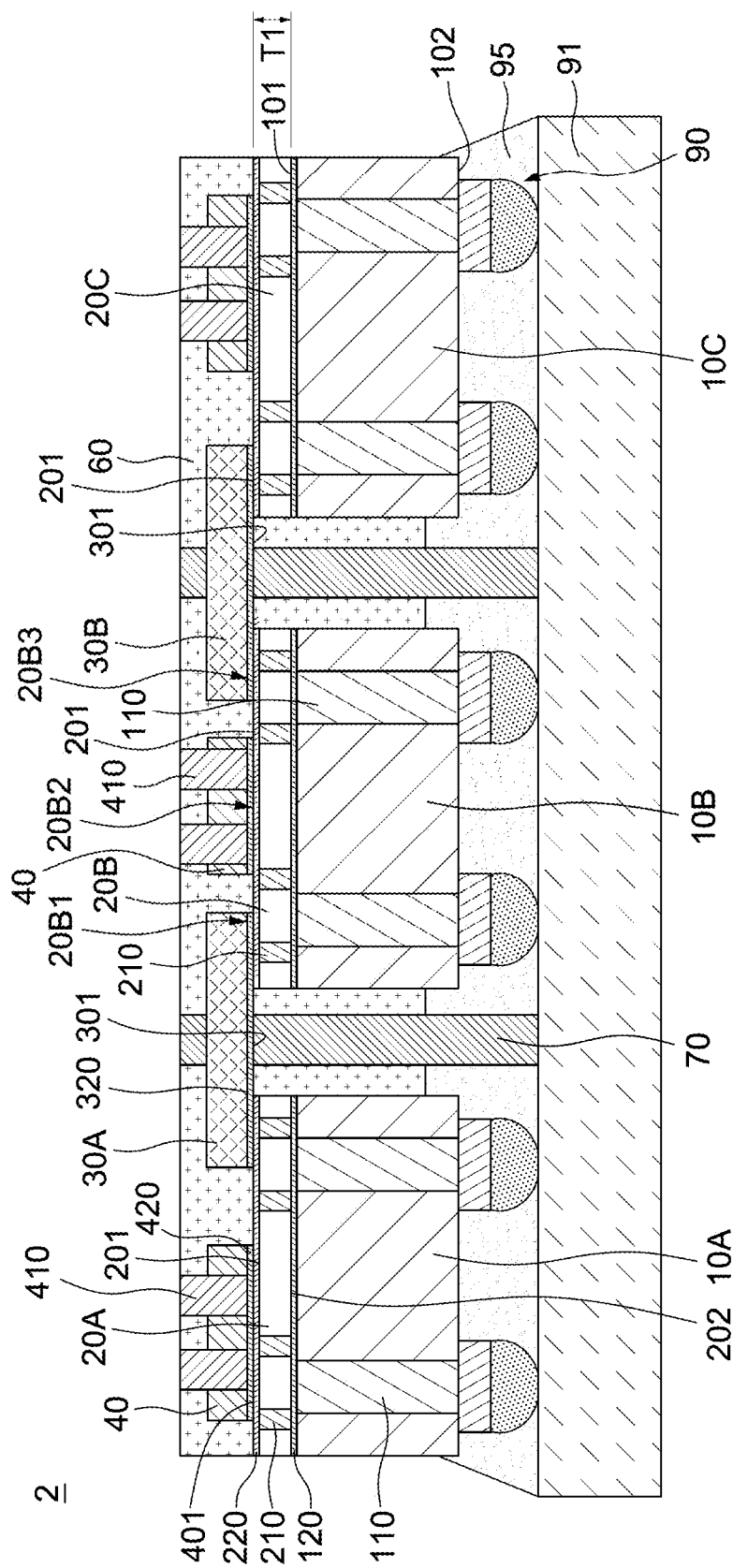
FIG. 2A is a side view of an electronic package in accordance with some embodiments of the present disclosure.

FIG. 2A is a side view of an electronic package 2 in accordance with some embodiments of the present disclosure. The electronic package 2 is similar to the electronic package 1 shown in FIG. 1A, with differences therebetween as follows. Descriptions of similar components are omitted.

In some embodiments, the connection structure 40 includes an active input/output (I/O) element. In some embodiments, the connection structure 40 includes an active surface 401 which is hybrid-bonded to the surface 201 (or the active surface) of the processing component (e.g., the processing components 20A, 20B, and 20C). In some embodiments, the active surface 401 of the connection structure 40 is bonded to the surface 201 (or the active surface) of the processing component (e.g., the processing components 20A, 20B, and 20C) through a solder-free joint or a non-solder joint.

In some embodiments, the connection structure 40 includes an active element 420 (e.g., a circuit region) adjacent to the surface 401 of the connection structure 40. In some embodiments, the connection structure 40 further includes additional active elements (e.g., transistors) connected to the active element 420. In some embodiments, the active element 420 of the connection structure 40 is hybrid-bonded to the surface 201 (or the active surface) of the processing component (e.g., the processing components 20A, 20B, and 20C). In some embodiments, the active element 420 of the connection structure 40 is bonded to the surface 201 (or the active surface) of the processing component (e.g., the processing components 20A, 20B, and 20C) through a solder-free joint or a non-solder joint. In some embodiments, the connection structure 40 further includes one or more conductive vias 410. In some embodiments, the connection structure 40 includes a silicon-based body, and the conductive vias 410 pass through or penetrate the silicon-based body. The conductive vias 410 may be electrically connected to the processing component (e.g., the processing components 20A, 20B, and 20C) through the surface 201 and the surface 401. In some embodiments, a pitch of the conductive vias 410 is less than about 30 μm, less than about 25 μm, or less than about 20 μm.

In some embodiments, the connection structure 40 may be or include an interposer (e.g., an active interposer). In some embodiments, the connection structure 40 may be or include a silicon-based interposer, and the conductive vias 410 may be TSVs. In some embodiments, the protective element 60 covers or encapsulates the connection structures 40. In some embodiments, a wafer node of the processing component (or the processing core) is less than or smaller than a wafer node of the connection structure 40. In some embodiments, a wafer node of the processing component (or the processing core) may lead a wafer node of the connection structure 40 by one or more generations. For example, the connection structure 40 may be a 20 nm or more node wafer, such as a 28 nm or more node wafer, a 32 nm or more node wafer, or greater. In some embodiments, the connection structure 40 may be divided from or originating from a monolithic processing unit (e.g., a CPU, a MPU, a GPU, a MCU, an ASIC, or the like) and configured to replace an I/O element presumably integrated in the processing component (e.g., the processing components 20A, 20B, and 20C). In some embodiments, the connection structure 40 may be an I/O chiplet.

Figure 2B:
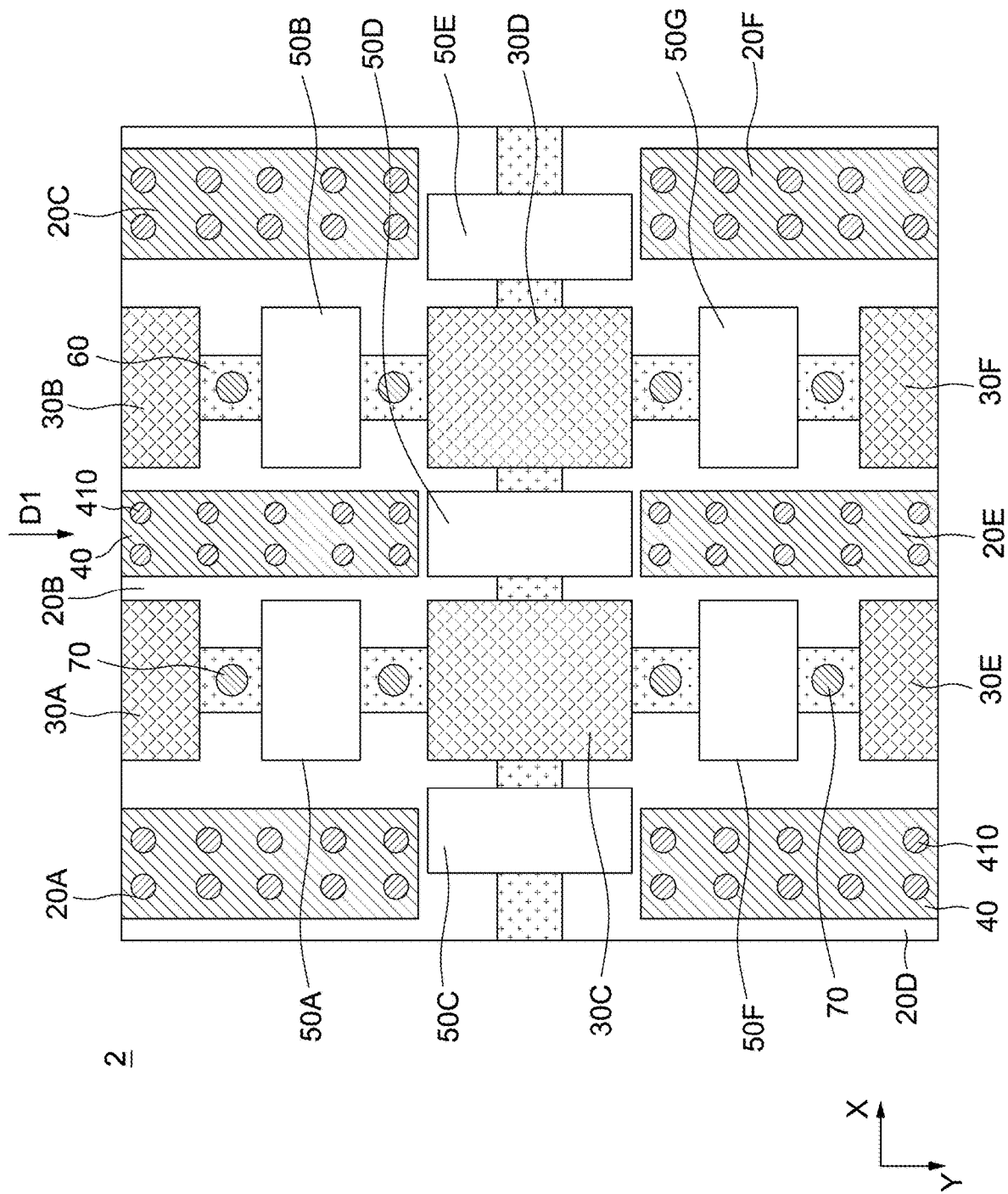
FIG. 2B is a top view of an electronic package in accordance with some embodiments of the present disclosure.

FIG. 2B is a top view of an electronic package 2 in accordance with some embodiments of the present disclosure. In some embodiments, FIG. 2A is a side view of the structure shown in FIG. 2B as viewed from a perspective D1. It should be noted that some components or structures are omitted for clarity.

In some embodiments, each of the connection structures 40 is disposed on each of the processing components (e.g., the processing components 20A-20F). In some embodiments, a projection of each of the connection structures 40 is within each of the corresponding processing components.

According to some embodiments of the present disclosure, a wafer node of the processing component (or the processing core) is less than or smaller than a wafer node of the active interposer (i.e., the connecting structure 40), and the active interposer is manufactured separately from the processing component and then bonded to the active surface of the processing component. Thus, less processing precision is required to manufacture the active interposer than for manufacturing the processing component (or the processing core), processes requiring different levels of processing precision are performed separately, overall manufacturing process is simplified, and costs are reduced.

In addition, according to some embodiments of the present disclosure, the connection structure 40 may be an I/O element divided from or originating from a monolithic processing unit and configured to replace an I/O element presumably integrated in the processing component (or the processing core). Therefore, the volume and/or the device area of the processing component can be further reduced.

Figure 3A:
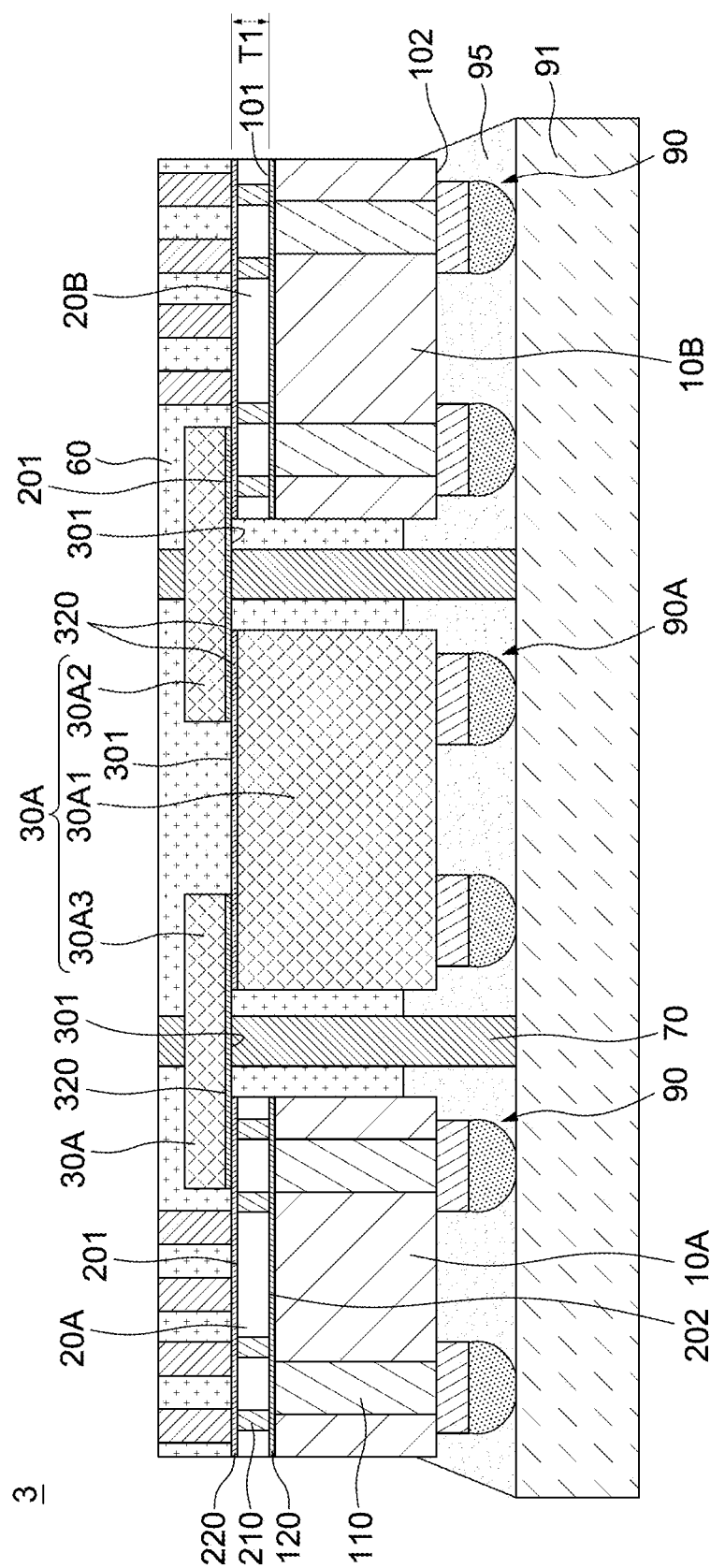
FIG. 3A is a side view of an electronic package in accordance with some embodiments of the present disclosure.

FIG. 3A is a side view of an electronic package 3 in accordance with some embodiments of the present disclosure. The electronic package 3 is similar to the electronic package 1 shown in FIG. 1A, with differences therebetween as follows. Descriptions of similar components are omitted.

In some embodiments, the memory unit 30A includes a plurality of memories (e.g., memories 30A1, 30A2, and 30A3). In some embodiments, the memory 30A1 is between the processing component 20A and the processing component 20B. In some embodiments, the memory 30A2 is over the processing component 20B and the memory 30A1. In some embodiments, the memory 30A2 is over the processing component 20B and electrically connected to the memory 30A1. In some embodiments, the memory 30A2 is configured as a data access interface between the processing component 20B and the memory 30A1. In some embodiments, the memory 30A3 is over the processing component 20A and the memory 30A1. In some embodiments, the memory 30A3 is over the processing component 20A and electrically connected to the memory 30A1. In some embodiments, the memory 30A3 is configured as a data access interface between the processing component 20A and the memory 30A1.

In some embodiments, an active surface 301 of the memory 30A1 is hybrid-bonded to an active surface 301 of the memory 30A2 and an active surface 301 of the third memory 30A3. In some embodiments, the active surface 301 of the memory 30A2 is hybrid-bonded to the active surface (i.e., the surface 201) of the processing component 20B, and the active surface 301 of the memory 30A3 is hybrid-bonded to the active surface (i.e., the surface 201) of the processing component 20A. In some embodiments, the memory 30A1 includes an active element 320 (e.g., a circuit region) adjacent to the active surface 301 and hybrid-bonded to an active element 320 (e.g., a circuit region) of the memory 30A2 and an active element 320 (e.g., a circuit region) of the third memory 30A3. In some embodiments, the active element 320 of the memory 30A2 is hybrid-bonded to the active surface (i.e., the surface 201) of the processing component 20B, and the active element 320 of the memory 30A3 is hybrid-bonded to the active surface (i.e., the surface 201) of the processing component 20A.

In some embodiments, the processing component 20A and the processing component 20B may be configured to access data stored in the memories 30A1, 30A2, and 30A3 of the memory unit 30A. In some embodiments, the processing component 20A and the processing component 20B are configured to access the memories 30A1, 30A2, and 30A3 of the memory unit 30A depending on a computing loading of the processing component 20A and the processing component 20B.

In some embodiments, electrical contacts 90A between the memory 30A1 and the substrate 91 are dummy electrical contacts and configured to support the memory 30A1. In some embodiments, the electrical contacts 90A may be configured to dissipate heat from the memory 30A1.

Figure 3B:
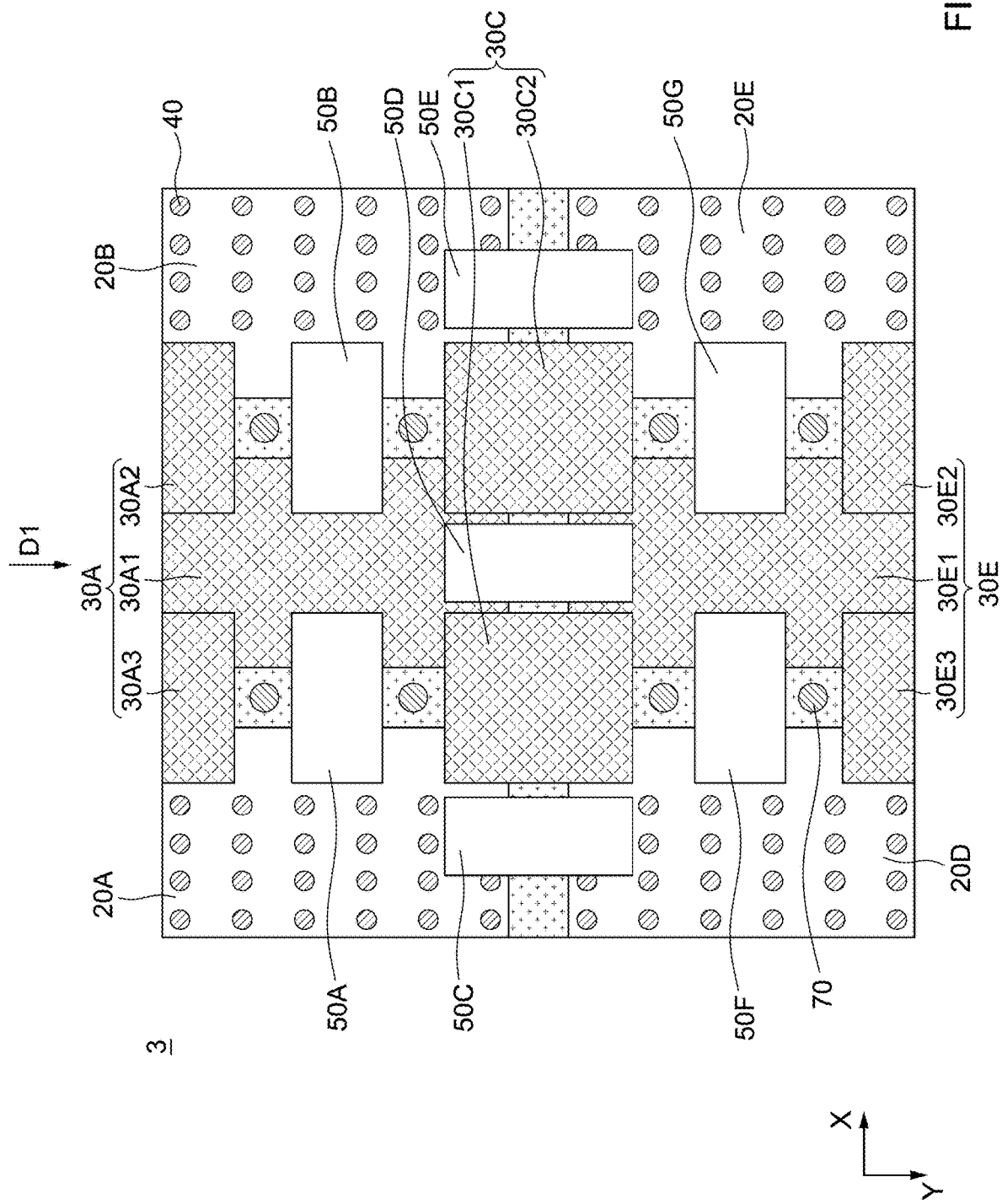
FIG. 3B is a top view of an electronic package in accordance with some embodiments of the present disclosure.

FIG. 3B is a top view of an electronic package 3 in accordance with some embodiments of the present disclosure. In some embodiments, FIG. 3A is a side view of the structure shown in FIG. 3B as viewed from a perspective D1. It should be noted that some components or structures are omitted for clarity.

In some embodiments, the memory unit 30A and the memory unit 30C are interconnected to each other directly. In some embodiments, the memory unit 30C includes memories 30C1 and 30C2. In some embodiments, the memory 30C1 is over and electrically connected to the memory 30A1. In some embodiments, the memory 30C1 is hybrid-bonded to the memory 30A1. In some embodiments, the memory 30C2 is over and electrically connected to the memory 30A1. In some embodiments, the memory 30C2 is hybrid-bonded to the memory 30A1. In some embodiments, the memory 30C1 and the memory 30C2 are interconnected to each other through the memory 30A1.

In some embodiments, the memory unit 30E includes a plurality of memories (e.g., memories 30E1, 30E2, and 30E3). In some embodiments, the memory 30E1 is between the processing component 20D and the processing component 20E. In some embodiments, the memory 30E2 is over the processing component 20E and the memory 30E1. In some embodiments, the memory 30E2 is over the processing component 20E and electrically connected to the memory 30E1. In some embodiments, the memory 30E2 is configured as a data access interface between the processing component 20E and the memory 30E1. In some embodiments, the memory 30E3 is over the processing component 20D and the memory 30E1. In some embodiments, the memory 30E3 is over the processing component 20D and electrically connected to the memory 30E1. In some embodiments, the memory 30E3 is configured as a data access interface between the processing component 20D and the memory 30E1.

In some embodiments, the memory unit 30E and the memory unit 30C are interconnected to each other directly.

In some embodiments, the memory 30C1 is over and electrically connected to the memory 30E1. In some embodiments, the memory 30C1 is hybrid-bonded to the memory 30E1. In some embodiments, the memory 30C2 is over and electrically connected to the memory 30E1. In some embodiments, the memory 30C2 is hybrid-bonded to the memory 30E1. In some embodiments, the memory 30C1 and the memory 30C2 are interconnected to each other through the memory 30E1.

In some embodiments, the bridging component 50D is disposed over or stacked on the memories 30A1 and 30E1. In some embodiments, the bridging component 50D electrically connects the memories 30A1 and 30E1. In some embodiments, the bridging component 50D is configured to provide signal or data transmission between the memories 30A1 and 30E1.

Figure 4A:
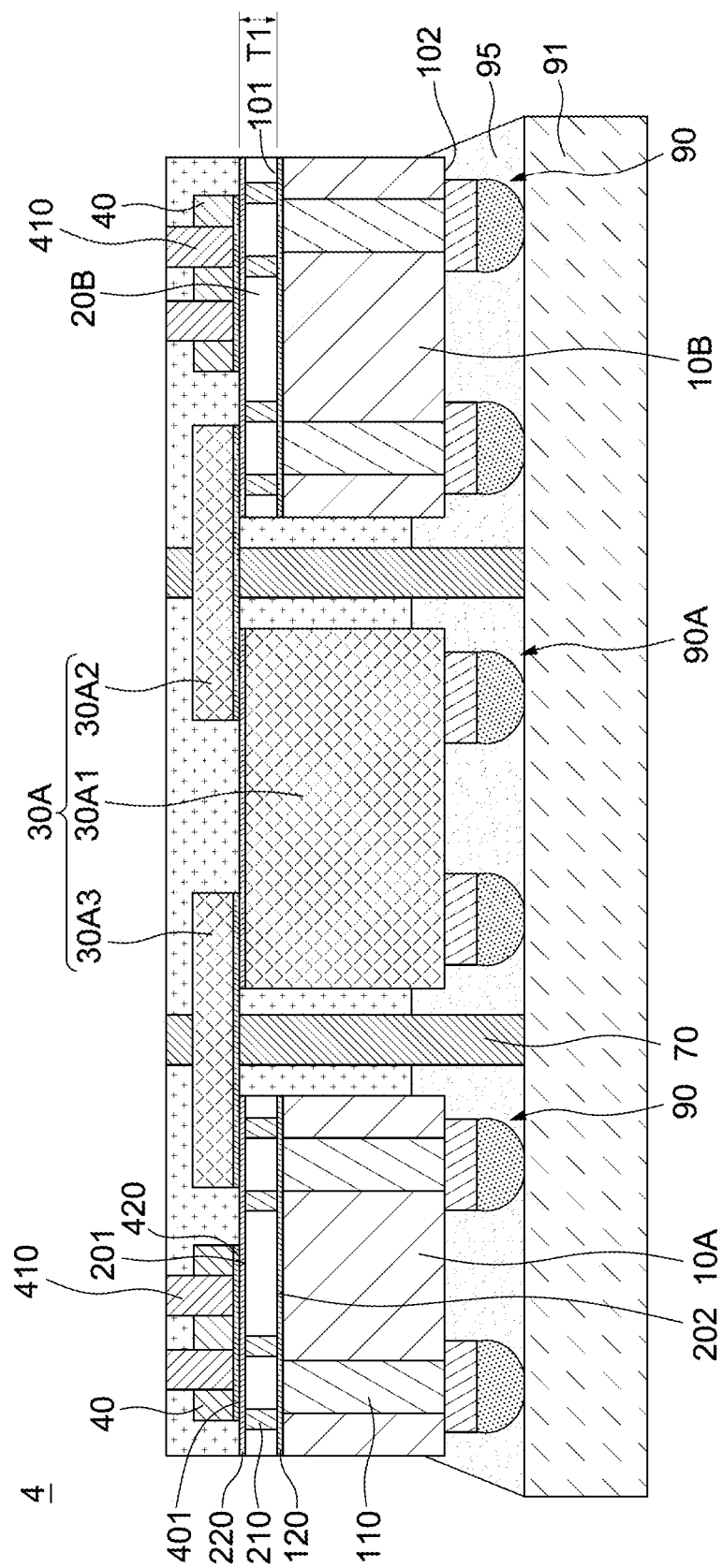
FIG. 4A is a side view of an electronic package in accordance with some embodiments of the present disclosure.

FIG. 4A is a side view of an electronic package 4 in accordance with some embodiments of the present disclosure. The electronic package 4 is similar to the electronic package 1 shown in FIG. 1A, with differences therebetween as follows. Descriptions of similar components are omitted.

In some embodiments, the connection structure 40 includes an active input/output (I/O) element. In some embodiments, the memory unit 30A includes a plurality of memories (e.g., memories 30A1, 30A2, and 30A3). In some embodiments, an active surface 301 of the memory 30A1 is hybrid-bonded to an active surface 301 of the memory 30A2 and an active surface 301 of the third memory 30A3.

Figure 4B:
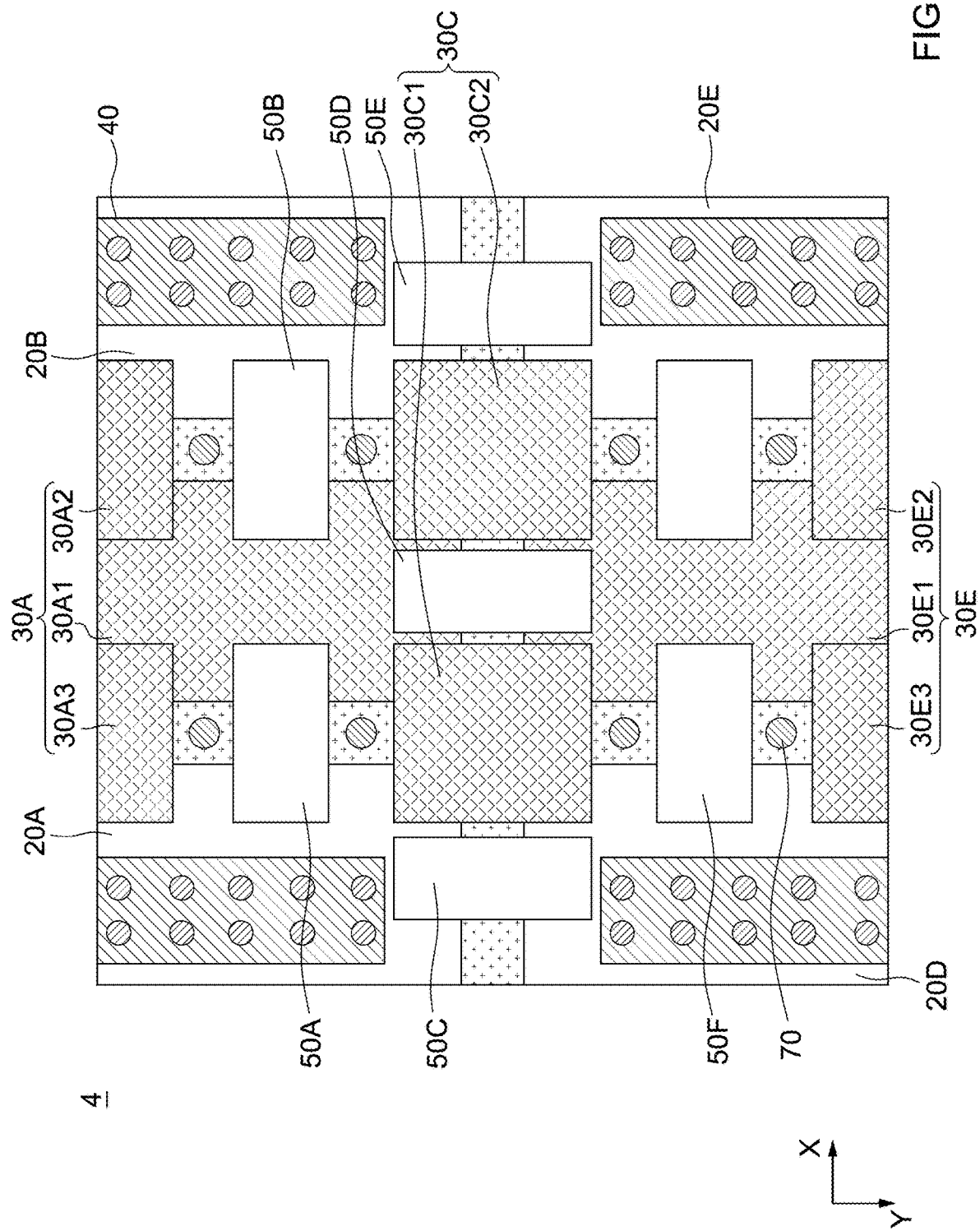
FIG. 4B is a top view of an electronic package in accordance with some embodiments of the present disclosure.

FIG. 4B is a top view of an electronic package in accordance with some embodiments of the present disclosure.

In some embodiments, the memory unit 30A and the memory unit 30C are interconnected to each other directly. In some embodiments, the memory unit 30E and the memory unit 30C are interconnected to each other directly.

Figure 5:
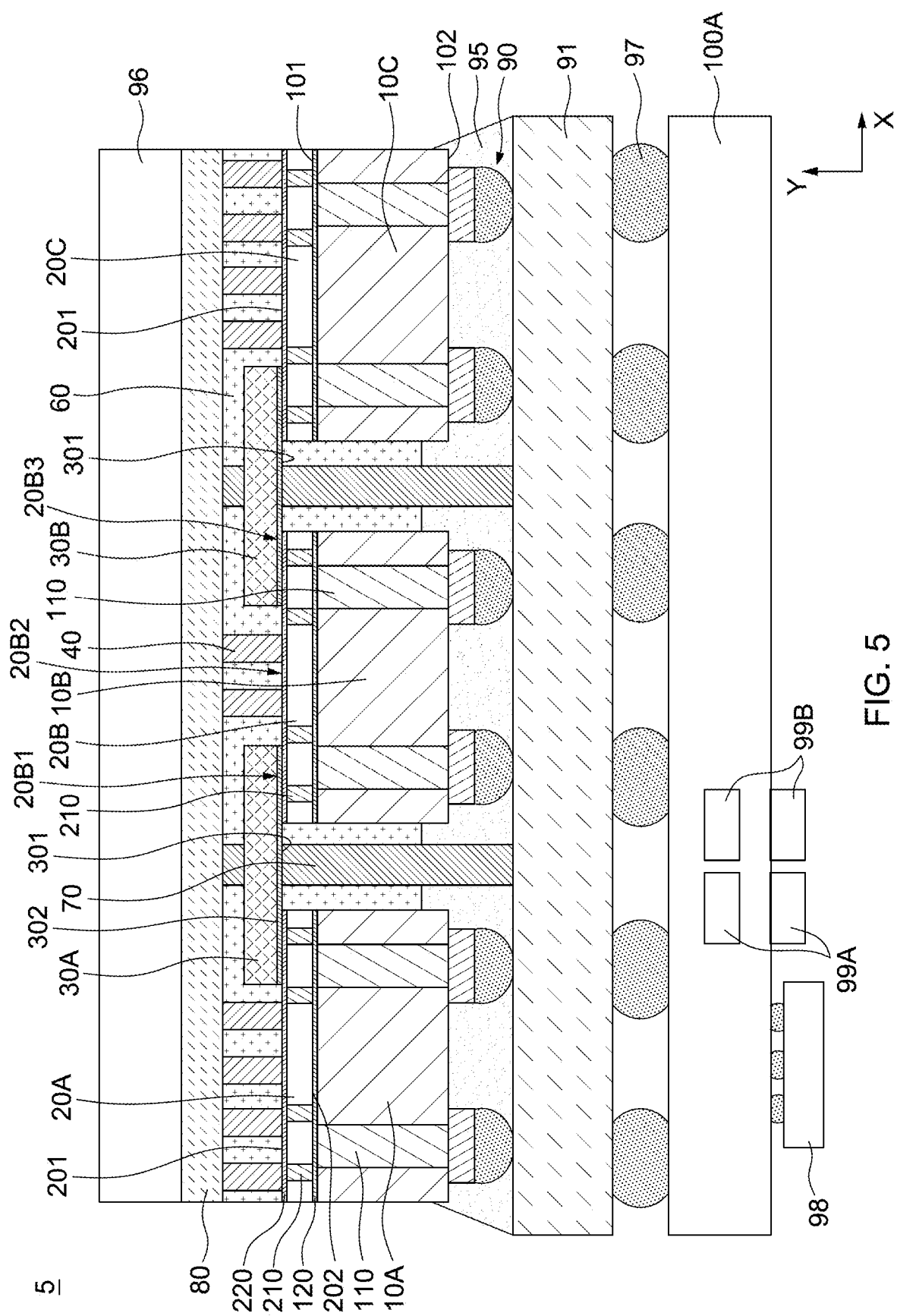
FIG. 5 is a side view of an electronic package in accordance with some embodiments of the present disclosure.

FIG. 5 is a side view of an electronic package 5 in accordance with some embodiments of the present disclosure. The electronic package 5 is similar to the electronic package 1 shown in FIG. 1A, with differences therebetween as follows. Descriptions of similar components are omitted. In some embodiments, the electronic package 5 further includes a substrate 100A, an interconnection structure 80, a heat dissipation structure 96, electrical contacts 97, a power regulating component 98, and passive components 99A and 99B.

The substrate 100A may include, for example, a printed circuit board, such as a paper-based copper foil laminate, a composite copper foil laminate, or a polymer-impregnated glass-fiber-based copper foil laminate. The substrate 100A may include an interconnection structure, such as a plurality of conductive traces or a through via. In some embodiments, the substrate 100A includes a ceramic material or a metal plate. In some embodiments, the substrate 100A may include an organic substrate or a leadframe. In some embodiments, the substrate 100A may include a two-layer substrate which includes a core layer and a conductive material and/or structure disposed on an upper surface and a bottom surface of the substrate 100A. The conductive material and/or structure may include a plurality of traces.

In some embodiments, the substrate 91 is bonded to the substrate 100A. In some embodiments, the substrate 91 is electrically connected to the substrate 100A through the electrical contacts 97. In some embodiments, the electrical contacts 97 include solder balls, e.g., C4 bump, a BGA, or a LGA.

In some embodiments, the interconnection structure 80 is over the processing components (e.g., the processing components 20A, 20B, and 20C). In some embodiments, the interconnection structure 80 is over and electrically connects the connection structure 40 and the connection structure 70. In some embodiments, the interconnection structure 80 is electrically connected to the surface(s) 201 of one or more of the processing components (e.g., the processing components 20A, 20B, and 20C) through the connection structure(s) 40. In some embodiments, the interconnection structure 80 is over the processing components 20A, 20B, and 20C and the connection structures 70. In some embodiments, the interconnection structure 80 is electrically connected to the connection structures 70. In some embodiments, the interconnection structure 80 is configured to provide interconnection between the connection structures 70 and the one or more of the processing components 20A, 20B, and 20C. In some embodiments, at least one of the connection structures 70 is configured to transmit a signal from at least one of the processing components 20A, 20B, and 20C. In some embodiments, an electrical path passes through the connection structure 40, the interconnection structure 80, and the connection structure 70. In some embodiments, the interconnection 80 may be or include an RDL.

In some embodiments, the power regulating component 98 may be disposed on the substrate 100A and/or integrated within the substrate 100A. In some embodiments, the passive components 99A and 99B may be disposed on the substrate 100A and/or integrated within the substrate 100A. The power regulating component 98 may include a voltage regulator, such as a linear regulator or a switching regulator. The power regulating component may include a step-down (buck) converter, a step-up (boost) converter, an analog-to-digital converter, a digital-to-analog converter, an AC-DC converter, a DC-DC converter, other types of converters, or a combination thereof. The passive components 99A and 99B may be or include one or more inductance devices (or inductors) and/or one or more capacitance devices (or capacitors). The passive components 99A and 99B may further include one or more passive devices including, for example, resistors, diodes, fuses, antifuses, etc. In some embodiments, the passive components 99A are inductors, and the passive components 99B are capacitors.

In some embodiments, the heat dissipation structure 96 is disposed on the interconnection structure 80. In some embodiments, the electronic package 5 includes a heat dissipation path from the connection structures 70 to the heat dissipation structure 96. In some embodiments, the connection structure 70 is connected to the heat dissipation structure 96 and configured to provide the heat dissipation path. In some embodiments, one or more of the connection structures 70 are not connected (or electrically connected) to the interconnection structure 80 and only serve to provide the heat dissipation path to the heat dissipation structure 96. In some embodiments, the heat dissipation structure 96 includes a heat sink.

Figure 6:
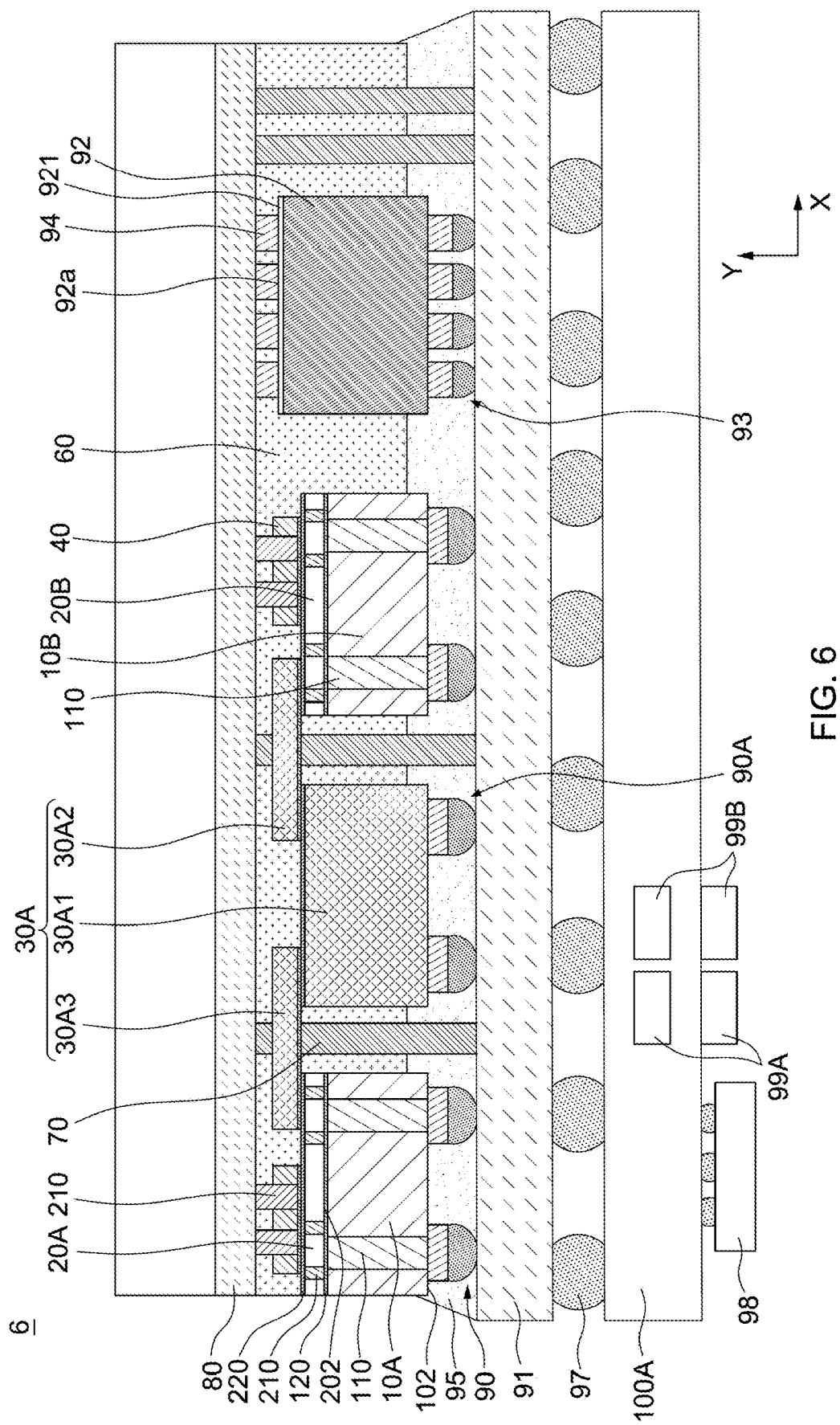
FIG. 6 is a side view of an electronic package in accordance with some embodiments of the present disclosure.

FIG. 6 is a side view of an electronic package 6 in accordance with some embodiments of the present disclosure. The electronic package 6 is similar to the electronic package 4 shown in FIG. 4A, with differences therebetween as follows. Descriptions of similar components are omitted. In some embodiments, the electronic package 6 further includes a substrate 100A, an interconnection structure 80, a memory component 92, a heat dissipation structure 96, a power regulating component 98, and passive components 99A and 99B.

In some embodiments, the memory component 92 is disposed on and electrically connected to the substrate 91. In some embodiments, the memory component 92 is electrically connected to the substrate 91 through electrical contacts 93. In some embodiments, the memory component 92 includes an active element 921 (e.g., a circuit region) adjacent to an active surface 92a of the memory component 92. In some embodiments, the memory component 92 is electrically connected to the interconnection structure 80 through connection structures 94. In some embodiments, the interconnection structure 80 is configured to provide power to the memory component 92. In some embodiments, the memory component 92 may be or include a high bandwidth memory (HBM). In some embodiments, the electrical contacts 93 include solder balls, e.g., C4 bump, a BGA, or a LGA. In some embodiments, the connection structures 94 include conductive pads or conductive vias.

In some embodiments, the protective element 60 covers or encapsulates the processing components 20A and 20B, the memory unit 30A, and the memory component 92. In some embodiments, the protective element 60 covers or encapsulates the carriers 10A and 10B, the processing components 20A and 20B, the memory unit 30A, the connection structures 40, 70 and 94, and the memory component 92.

FIG. 7A, FIG. 7B, FIG. 7C, and FIG. 7D illustrate various stages of a method of manufacturing an electronic package 1' in accordance with some embodiments of the present disclosure.

Figure 7A:
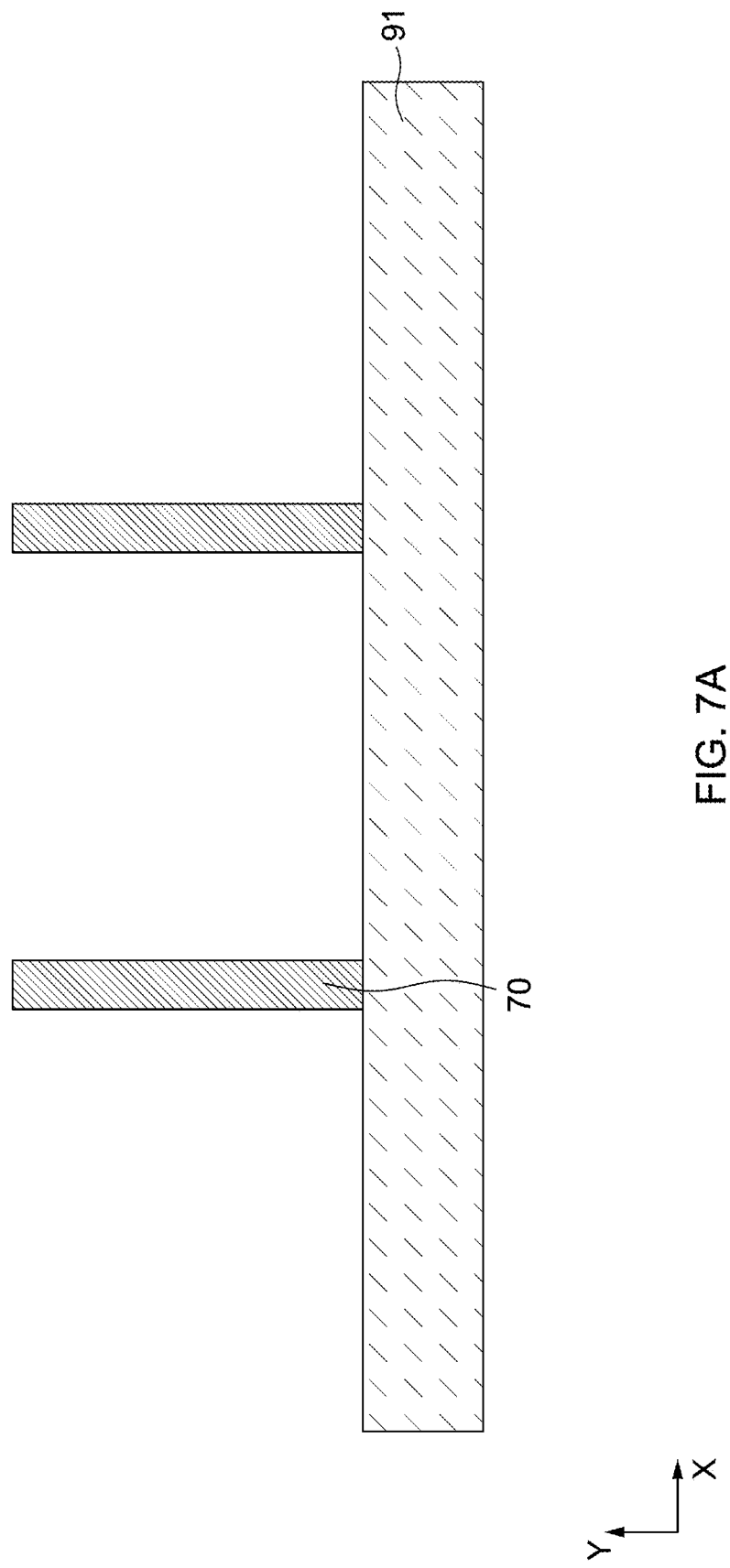
FIG. 7A, FIG. 7B, FIG. 7C, and FIG. 7D illustrate various stages of a method of manufacturing an electronic package in accordance with some embodiments of the present disclosure.

Referring to FIG. 7A, connection structures 70 may be formed on a substrate 91. In some embodiments, the substrate 91 includes an interconnection structure, such as an RDL. In some embodiments, the connection structures 70 include conductive pillars.

Figure 7B:
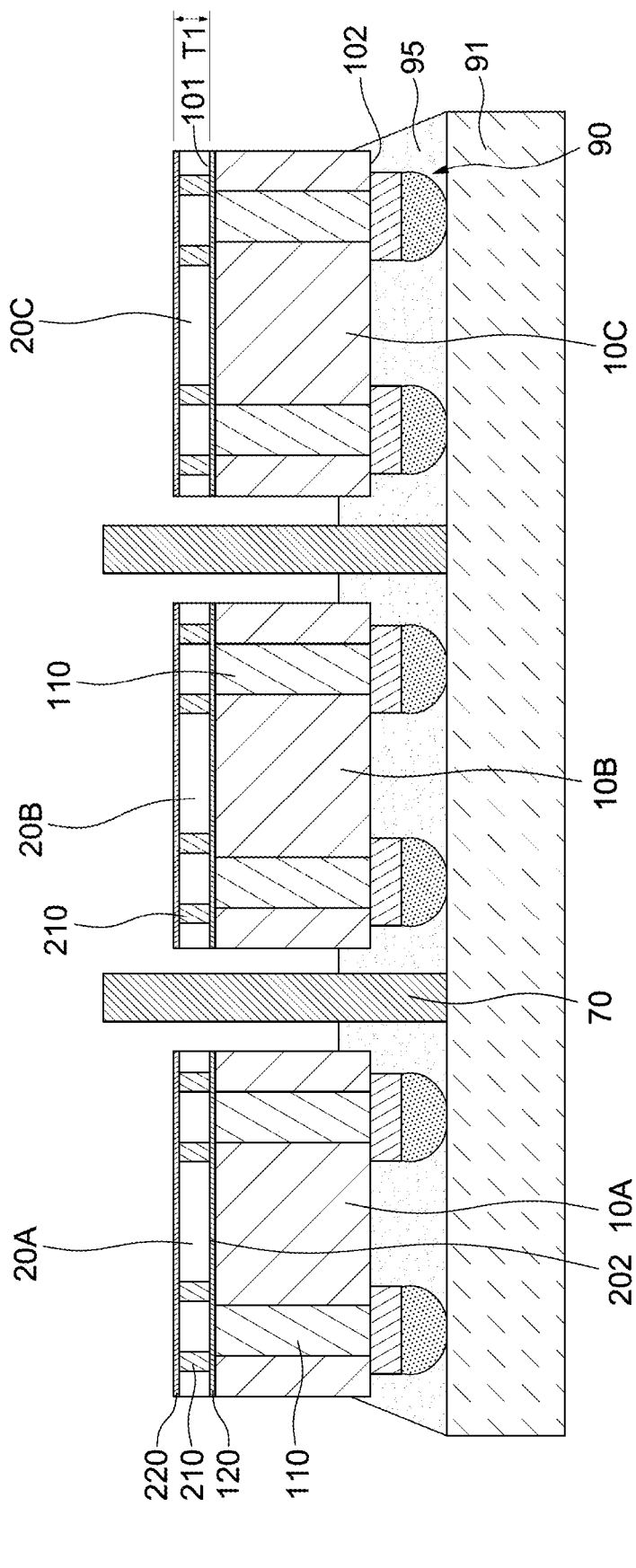

Referring to FIG. 7B, processing components 20A, 20B, and 20C may be disposed on corresponding carriers 10A, 10B, and 10C to form integrated structures each including one carrier and one processing component, and these integrated structures may be disposed on the substrate 91. In some embodiments, the processing components 20A, 20B, and 20C are flip-chip bonded to the carriers 10A, 10B, and 10C. In some embodiments, the carriers 10A, 10B, and 10C are bonded to the substrate 91 through electrical contacts 90. In some embodiments, the electrical contacts 90, a portion of the carriers 10A, 10B, and 10C, and a portion of the connection structures 70 are covered or encapsulated by an underfill 95. In some embodiments, the carriers 10A, 10B, and 10C include capacitors, such as DTCs. In some embodiments, the processing components 20A, 20B, and 20C include processing cores.

Figure 7C:
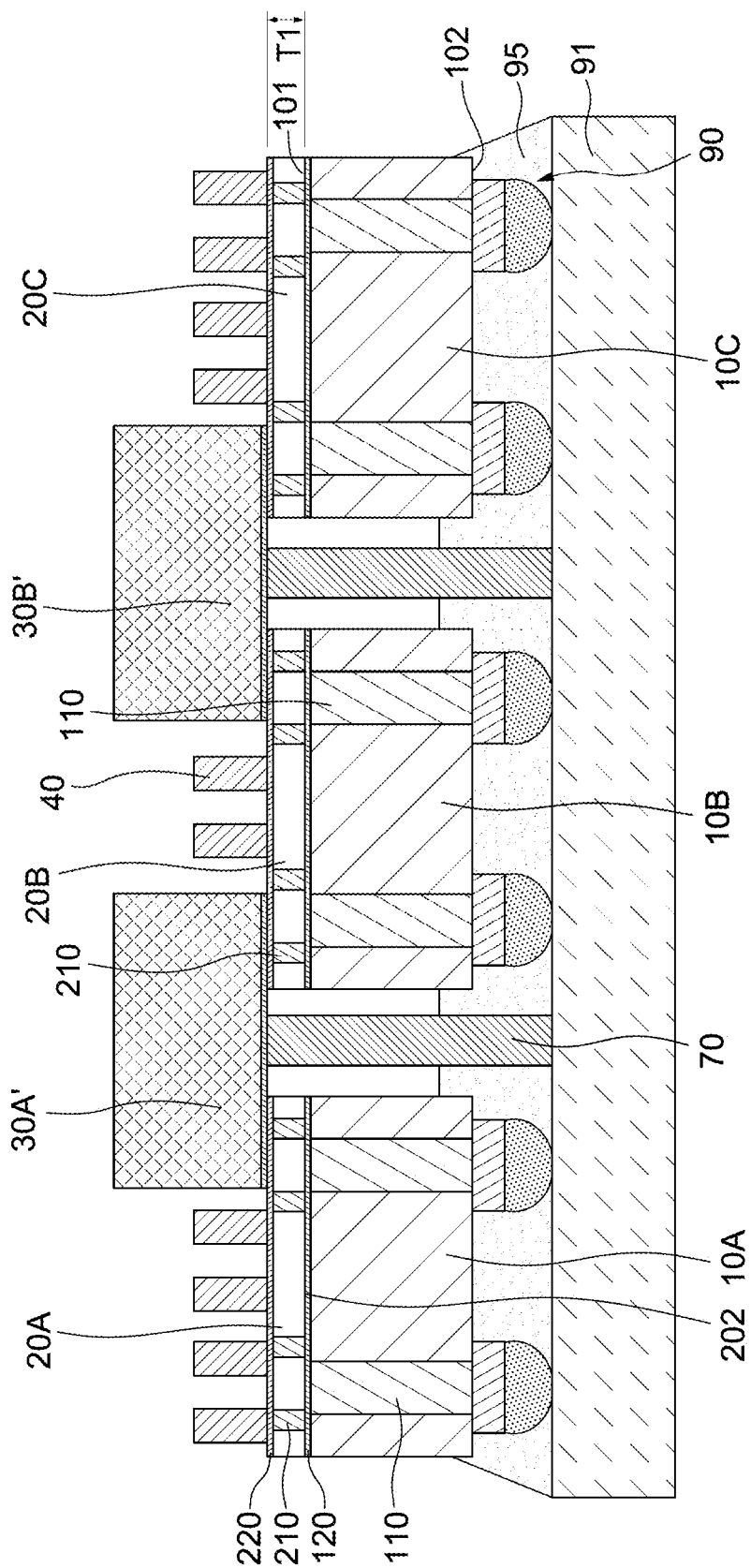

Referring to FIG. 7C, memory units 30A' and 303 may be hybrid-bonded to the processing components 20A, 20B, and 20C, and connection structures 40 may be disposed on active surfaces (i.e., surfaces 201) of the processing components 20A, 20B, and 20C. In some embodiments, each of the memory units 30A' and 30B' is hybrid-bonded to at least two of the processing components 20A, 20B, and 20C. In some embodiments, the memory units 30A' and 30B' are spaced apart from the connection structures 70. In some embodiments, the memory units 30A' and 30B' include cache memories.

Figure 7D:
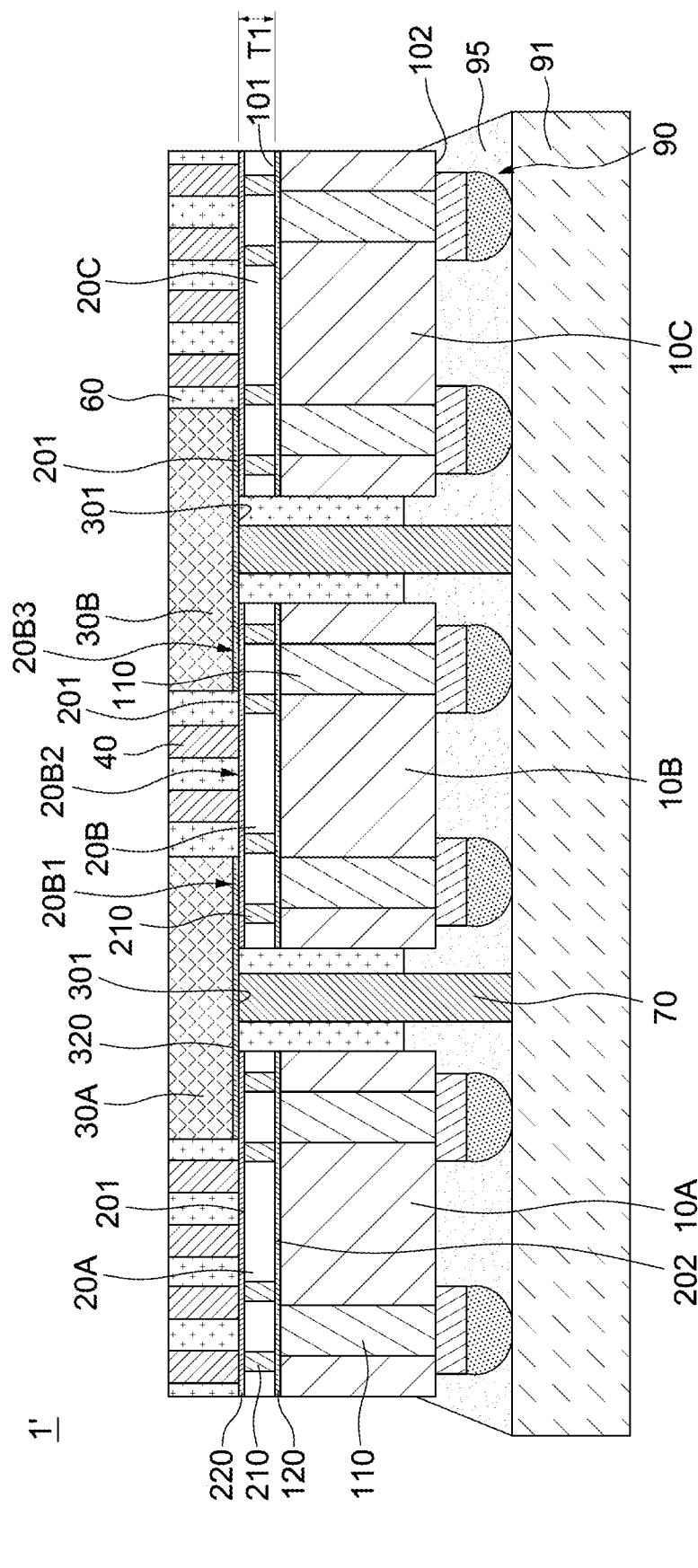

Referring to FIG. 7D, the memory units 30A' and 30B' and the connection structures 40 may be covered or encapsulated by a protective element 60, and a grinding operation may be performed to thin the memory units 30A' and 30B' to form memory units 30A and 30B. In some embodiments, backside surfaces of the memory units 30A and 30B are exposed from the protective element 60. As such, the electronic package 1' is formed.

In some other embodiments, referring to FIG. 7C, memory units 30A and 30B may be hybrid-bonded to the processing components 20A, 20B, and 20C, the memory units 30A and 30B and the connection structures 40 may be covered or encapsulated by the protective element 60, and a grinding operation may be performed to thin the connection structures 40 and the protective element 60 without further thinning the memory units 30A and 30B. As such, the electronic package 1 illustrated in FIG. 1A is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
    a first processing component;
    a second processing component;
    a first memory unit over the first processing component and the second processing component, wherein the first processing component and the second processing component are configured to access data stored in the first memory unit; and
    a third processing component and a second memory unit on the first processing component and the third processing component, wherein the first processing component and the third processing component are configured to access data stored in the second memory unit.

2. The electronic package of claim 1, wherein the first memory unit has a first access region accessed by the first processing component and a second access region accessed by the second processing component, and a ratio of a first occupied capacity of the first access region to a second occupied capacity of the second access region depends on a computing loading of the first processing component and the second processing component.

3. The electronic package of claim 1, wherein the first memory unit comprises:
    a first memory between the first processing component and the second processing component;
    a second memory over the first processing component and the first memory; and
    a third memory over the second processing component and the first memory, wherein the second memory is configured as a data access interface between the first processing component and the first memory.

4. The electronic package of claim 1, wherein the first processing component has a first portion covered by the first memory unit and a second portion exposed from the first memory unit, and the electronic package further comprises a first connection structure on the second portion of the first processing component and configured to provide an electrical path for external connection.

5. The electronic package of claim 4, further comprising a second connection structure passing through at least a portion of the first processing component.

6. The electronic package of claim 5, wherein the first connection structure is configured to receive a signal from the first processing component passing through an active surface of the first processing component.

7. The electronic package of claim 6, further comprising:
    a carrier supporting the first processing component; and
    a third connection structure in the carrier and configured to transmit a power to the second connection structure.

8. The electronic package of claim 4, further comprising:
    a third connection structure disposed between the first processing component and the second processing component, wherein a portion of the third connection structure extends along a lateral side of the first memory unit.

9. The electronic package of claim 8, further comprising an interconnection structure over and electrically connecting the first connection structure and the third connection structure.

10. The electronic package of claim 1, wherein the first memory unit and the second memory unit are interconnected to each other through the first processing component.

11. The electronic package of claim 1, further comprising a bridging component over and electrically connecting the first processing component with the second processing component.

12. An electronic package, comprising:
    a memory unit comprising a bottom surface having a first region and a second region distinct from the first region;
    at least two processing units disposed under the first region and the second region, respectively, and electrically connected to the memory unit;
    a bridging component disposed over the at least two processing units and configured to transmit a first signal from a first processing unit to a second processing unit of the at least two processing units; and
    a plurality of connection structures, wherein at least one connection structure of the plurality of connection structures is disposed between the at least two processing units, the memory unit, and the bridging component, and the at least one connection structure is configured to transmit a second signal from at least one processing unit of the at least two processing units.

13. The electronic package of claim 12, wherein the at least one processing unit of the at least two processing units comprises an active surface and a passive surface opposite to the active surface, and an active surface of the memory unit is closer to the active surface than the passive surface of the at least one processing unit.

14. The electronic package of claim 13, wherein the at least one processing unit is configured to receive a power from the passive surface.

15. The electronic package of claim 12, wherein the processing units are configured to access data stored in the memory unit.

16. An electronic package, comprising:
    a first processing unit;
    a second processing unit;
    a first memory unit stacked on the first processing unit and the second processing unit;

wherein the first processing unit, the second processing unit, and the first memory unit have different wafer nodes;
a third processing unit spaced apart from the first processing unit and the second processing unit;
a first bridging component stacked on the first processing unit and the third processing unit and configured to transmit a signal from the first processing unit to the third processing unit; and
a second bridging component stacked on the first processing unit and the second processing unit and between the first memory unit and a second memory unit.

* * * * *